United States Patent
Kim et al.

(10) Patent No.: US 9,035,171 B2
(45) Date of Patent: May 19, 2015

(54) DYE-SENSITIZED SOLAR CELL

(75) Inventors: Won Jung Kim, Seoul (KR); Sang Hak Kim, Seoul (KR); Mi Yeon Song, Seoul (KR); Yong Jun Jang, Gyeonggi-do (KR); Yong-Gu Kim, Gyeonggi-do (KR); In Woo Song, Gyeonggi-do (KR); Ji Yong Lee, Gyeonggi-do (KR); Ki Chun Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 164 days.

(21) Appl. No.: 13/315,969

(22) Filed: Dec. 9, 2011

(65) Prior Publication Data

US 2013/0056057 A1 Mar. 7, 2013

(30) Foreign Application Priority Data

Sep. 7, 2011 (KR) .................. 10-2011-0090571

(51) Int. Cl.
  *H01L 31/0224* (2006.01)
  *H01G 9/20* (2006.01)
  *H01L 51/44* (2006.01)

(52) U.S. Cl.
  CPC .......... *H01G 9/2068* (2013.01); *H01G 9/2031* (2013.01); *H01G 9/2059* (2013.01); *H01L 51/445* (2013.01); *Y02E 10/542* (2013.01)

(58) Field of Classification Search
  CPC . H01G 9/2068; H01G 9/2031; H01G 9/2059; H01L 51/445
  USPC ................................................ 136/252, 256
  See application file for complete search history.

(56) References Cited

U.S. PATENT DOCUMENTS

| 7,022,910 B2 * | 4/2006 | Gaudiana et al. ............. 136/256 |
| 2006/0162770 A1 * | 7/2006 | Matsui et al. ................. 136/263 |

FOREIGN PATENT DOCUMENTS

| JP | 2005-142084 | 6/2005 |
| JP | 2005-166313 | 6/2005 |
| JP | 2005-196982 | 7/2005 |
| JP | 2005-228615 | 8/2005 |
| JP | 2005-293862 | 10/2005 |
| JP | 2005-327595 | 11/2005 |
| JP | 2007-018909 | 1/2007 |
| JP | 2007-265636 | 10/2007 |
| JP | 2009-193813 | 8/2009 |
| KR | 10-1024876 | 12/2005 |

OTHER PUBLICATIONS

English Machine translation of Gonda et al JP 2005-166313.*
Machine English translation of Nakagawa JP 2005-142084A.*
Machine English translation of Kaneko et al JP 2009-193813A.*

* cited by examiner

*Primary Examiner* — Keith Hendricks
*Assistant Examiner* — Kourtney S Carlson
(74) *Attorney, Agent, or Firm* — Mintz Levin Cohn Ferris Glovsky and Popeo, P.C.; Peter F. Corless

(57) ABSTRACT

The present invention provides a dye-sensitized solar cell which enhances an area of a photo electrode by arranging metal wires on a surface of a transparent substrate or a transparent conductive layer without degrading a transparency of the solar cell, allowing the metal wires to act as a collector electrode exclusively or together with a metal electrode.

7 Claims, 11 Drawing Sheets

DYE-SENSITIZED SOLAR CELL

CROSS-REFERENCE TO RELATED APPLICATION

This application claims under 35 U.S.C. §119(a) the benefit of Korean Patent Application No. 10-2011-0090571 filed Sep. 7, 2011, the entire contents of which are incorporated herein by reference.

BACKGROUND (a) Technical Field

The present invention relates to a dye-sensitized solar cell including therein mesh type metal wire(s).

(b) Background Art

Recently, with growing interest on eco-friendly energy sources, there have been active studies on photoelectric conversion elements such as solar cells. Among them are dye-sensitized solar cells (DSSC), which are applicable to various industry areas including construction industry and vehicle industry.

As shown in FIG. 8, a typical unit dye-sensitized solar cell includes a working electrode, a counter electrode, and an electrolyte 170 filled therebetween. The working electrode and the counter electrode are stacked and bonded to each other by means of a bonding material 160.

The working electrode includes a transparent conductive layer 110, an oxide semiconductor thick film 120, a metal electrode 130, and a metal electrode protecting layer 140. A Fluorine Doped Tin Oxide (FTO) transparent conductive layer, for example, can be used as the transparent conductive layer 110. The transparent conductive layer 110 is coated on a surface of a transparent substrate 100 so that photoelectrons can flow through the transparent conductive layer 110. The oxide semiconductor thick film 120 is formed with porous nanoparticles. Dye molecules are adsorbed on the oxide semiconductor thick film 120. The dye molecules function to absorb light and emit electrons. The emitted electrons are to be moved to an external electrode. The metal electrode 130 is formed in a metal grid structure and acts as a collector electrode. The metal electrode protecting layer 140 (e.g., glass fit) is provided to protect the metal electrode 130 by preventing corrosion of the metal electrode 130.

The counter electrode includes a transparent conductive layer 110, a metal electrode 130; a metal electrode protecting layer 140, and a catalytic electrode 150. The transparent conductive layer 110, the metal electrode 130, and the metal electrode protecting layer 140 of the counter electrode have the same or similar structures of those of the working electrode. The catalytic electrode 150 contains a catalyst such as platinum. The electrolyte 170 can be oxidized during the operation of the dye-sensitized solar cell. The counter electrode serves to suitably reduce the electrolyte 170 in case the oxidation occurs.

If the dye-sensitized solar cell has a certain size or greater, the efficiency of the dye-sensitized solar cell may become decreased due to relatively high resistance of the transparent conductive layer 110. The metal electrode 130 is provided to minimize the decrease in the efficiency. Meanwhile, if the area of the metal electrode 130 is large, the efficiency can be less decreased, but the effective areas of the oxide semiconductor thick film 120 (photo electrode films) may be reduced, thereby lowering the overall output of the dye-sensitized solar cell The above information disclosed in this Background section is only for enhancement of understanding of the background of the invention and therefore it may contain information that does not form the prior art that is already known in this country to a person of ordinary skill in the art.

SUMMARY OF THE DISCLOSURE

In one aspect, the present invention provides a dye-sensitized solar cell including: a working electrode including a transparent conductive layer coated on a surface of a transparent substrate, an oxide semiconductor thick film to which a dye absorbing light and emitting electrons is adsorbed, and a metal electrode acting as a collector electrode; and a counter electrode including a transparent conductive layer coated on a surface of a transparent substrate, a metal electrode acting as a collector electrode, and a catalytic electrode, wherein metal wires are formed at equal intervals on an inner surface of the transparent substrate or on an inner surface of the transparent conductive layer of the working electrode, and the metal wires are conductively connected to a collector electrode.

In an exemplary embodiment, the metal electrodes formed on an inner surface of the transparent conductive layer of the working electrode at equal intervals are covered by the oxide semiconductor thick films formed on a surface of the transparent conductive layer, and the metal electrodes formed on an inner surface of the transparent conductive layer of the counter electrode at equal intervals are covered by the catalytic electrodes.

In another exemplary embodiment, the metal electrode of the working electrode and the metal electrode of the counter electrode are inserted into and arranged in inner surfaces of the transparent substrates.

In still another exemplary embodiment, the metal electrode of the working electrode and the metal electrode of the counter electrode are inserted into and arranged in inner surfaces of the transparent conductive layers.

In particular, the metal wires form one structure selected from a structure where the metal wires are linearly arranged at equal intervals longitudinally or transversely, a structure where the metal wires are linearly arranged at equal intervals obliquely, a mesh type structure where the metal wires cross longitudinally and transversely, a mesh type structure where the metal wires are arranged linearly in a longitudinal direction and arranged obliquely in a transverse direction, and a mesh type structure where the metal wires cross each other obliquely.

Preferably, the metal wires are arranged to have a width of 0.001 to 2000 micrometers, maintain an interval of 0.001 to 20000 micrometers, and have a height of 0.001 to 20 micrometers.

More preferably, the metal wires are arranged to have a width of 0.001 to 1000 micrometers, maintain an interval of 0.01 to 10000 micrometers, and have a height of 0.001 to 10 micrometers.

According to the present invention, each of the metal wires may be formed by coating a liquid such as ink or paste containing a metal on a surface of the transparent conductive layer through a well-known coating method such as screen printing, ink-jet printing, gravure coating, bar coating, and spraying. Alternatively, they may be formed through sputtering, by directly attaching a solid metal wire having a specific shape, or through any method for forming a metal wire.

The dye-sensitized solar cells according to the present invention have advantageous effects. For example, the effective area of the photo electrode can be enhanced while the transparency of the dye-sensitized solar cells is not degraded and. The dye-sensitized solar cells can be manufactured in simpler steps and at lower cost.

BRIEF DESCRIPTION OF THE DRAWINGS

The above and other features of the present invention will now be described in detail with reference to certain exemplary embodiments thereof illustrated in the accompanying drawings which are given herein below by way of illustration only, and thus are not limitative of the present invention, and wherein:

FIGS. 4A to 1C are sectional views illustrating a dye-sensitized solar cell according to the fourth embodiment of the present invention;

DETAILED DESCRIPTION

Hereinafter, exemplary embodiments of the present invention will be described with reference to the accompanying drawings so that those skilled in the art can easily carry out the invention.

First Embodiment

Figure 1A:
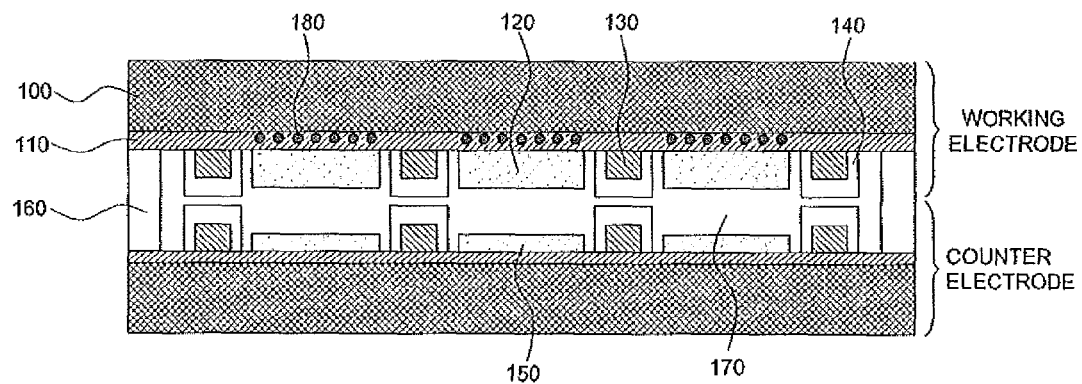
FIGS. 1A and 1B are sectional views illustrating a dye-sensitized solar cell according to the first embodiment of the present invention.

As illustrated in FIG. 1A, a dye-sensitized solar cell according to the first embodiment of the present invention includes a working electrode, and a counter electrode, and an electrolyte 170 filled therebetween. The working electrode and the counter electrode are stacked and bonded to each other by means of a bonding material 160.

The working electrode includes a transparent conductive layer 110, an oxide semiconductor thick film 120, a metal electrode 130, and a metal electrode protecting layer 140. A Fluorine Doped Tin Oxide (FTO) transparent conductive layer, for example, can be used as the transparent conductive layer 110. The transparent conductive layer 110 is coated on a surface of a transparent substrate 100 so that photoelectrons can flow through the transparent conductive layer 110. The oxide semiconductor thick film 120 is formed with porous nanoparticles. Dye molecules are adsorbed on the oxide semiconductor thick film 120. The dye molecules function to absorb light and emit electrons. The emitted electrons are to be moved to an external electrode. The metal electrode 130 is formed in a metal grid structure and acts as a collector electrode. The metal electrode protecting layer 140 (e.g., glass frit) is provided to protect the metal electrode 130 by preventing corrosion of the metal electrode 130. The oxide semiconductor thick film 120 is arranged between adjacent metal electrode protecting layers 140.

The counter electrode includes a transparent conductive layer 110, a metal electrode 130; a metal electrode protecting layer 140, and a catalytic electrode 150. The transparent conductive layer 110, the metal electrode 130, and the metal electrode protecting layer 140 of the counter electrode have the same or similar structures of those of the working electrode. The catalytic electrode 150 contains a catalyst such as platinum and is arranged between adjacent metal electrode protecting layers 140.

A plurality of thin metal wires 180 are formed in the transparent conductive layer 110 (preferably, on an inner surface of the transparent conductive layer) of the working electrode.

In particular, each of the metal wires 180 is linear or mesh-type. The width of the metal wire 180 can be adjusted so as to obtain sufficient transparency and electricity collecting performance of the dye-sensitized solar cell. If the width of the metal wire 180 is too small, the electricity collecting performance of the dye-sensitized solar cell may not be satisfactory. On the other hand, if the width of the metal wire 180 is too great, the transparency of the dye-sensitized solar cell may not be satisfactory. Preferably, the metal wire 180 may have a width of 0.001 to 2000 micrometers. More preferably, the metal wire 180 may have a width of 0.001 to 1000 micrometers.

The height of the metal wire 180 can be adjusted so as to obtain proper thickness of the transparent conductive layer 110 and/or the dye-sensitized solar cell. Preferably, the height of the metal wire 180 may be in the range of 0.001 to 10 micrometers.

Figure 1B:
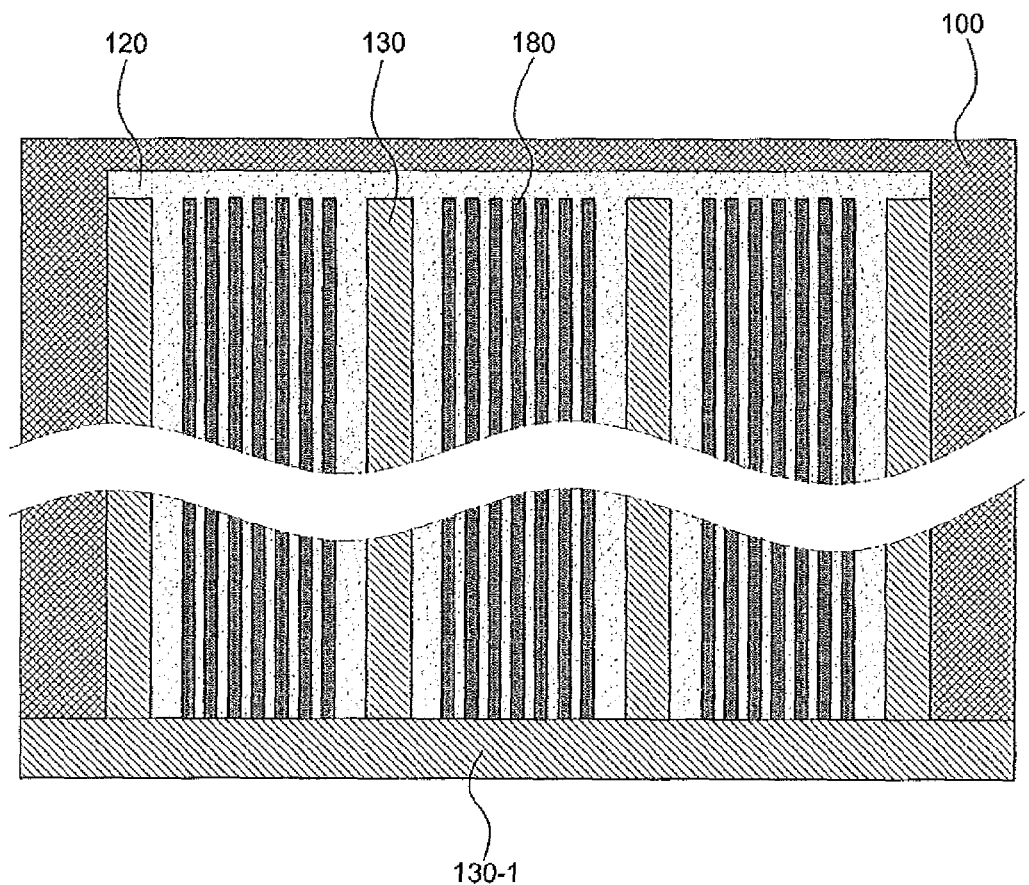

Meanwhile, as illustrated in FIG. 1B, the metal wires 180 are formed on an inner surface of the transparent conductive layer 110 of the working electrode. The metal wires 180 can be formed in various ways. For example, the metal wires 180 may be formed by coating a gas, liquid, or a solid (e.g., sol, ink, and paste) containing a metal on a surface portion(s) of the transparent conductive layer 110 by a known coating method such as screen printing, ink-jet printing, gravure coating, bar coating, and spraying, by sputtering, or by directly attaching a solid metal wire having a specific shape.

The metal wires 180 may be formed at predetermined intervals and with predetermined shapes. For example, the metal wires 180 may be formed at equal intervals. They may also be formed at different intervals. Also, they may be formed in parallel to each other. In addition, they may be of a mesh type where two or more different lines overlap at one or more points. As shown in FIG. 1B, the metal wires 180 may be connected directly to the metal electrode 130 and a metal collector electrode 130-1.

As mentioned above, the metal wires 180 are arranged so as not to degrade the transparency of the transparent conductive layer 110 and act as a collector electrode together with the metal electrode 130 to increase electricity collecting efficiency. As a result, the metal wires 180 increase electricity collecting efficiency while maintaining the effective areas of the oxide semiconductor thick film 120 and the metal electrode 130.

Second Embodiment

Figure 2A:
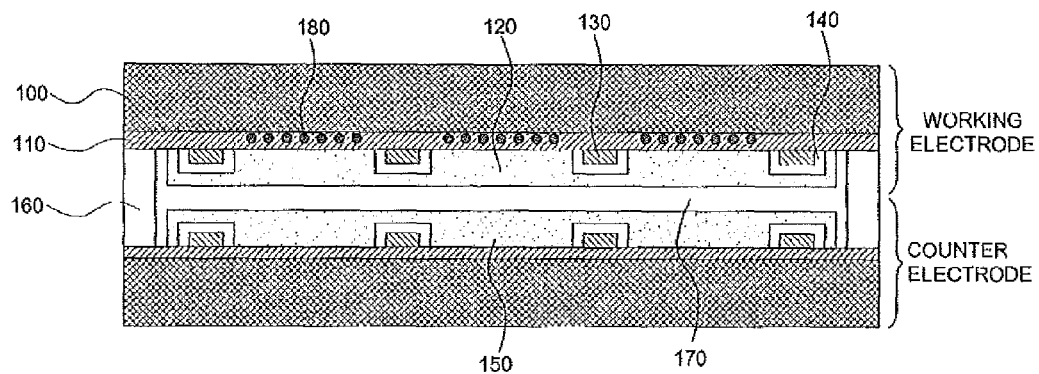
FIGS. 2A and 2B are sectional views illustrating a dye-sensitized solar cell according to the second embodiment of the present invention.

A dye-sensitized solar cell according to the second embodiment of the present invention has the same configuration as that of the first embodiment of the present invention, except that as illustrated in FIG. 2A, the oxide semiconductor thick film 120 (i.e., the photo electrode layer containing porous nanoparticles) of the working electrode is stacked to cover the metal electrode protecting layer 140 of the working electrode and the oxide semiconductor thick film 120 of the counter electrode is stacked to cover the metal electrode protecting layer 140 of the counter electrode, thereby increasing the effective areas of the oxide semiconductor thick films 120.

Figure 2B:
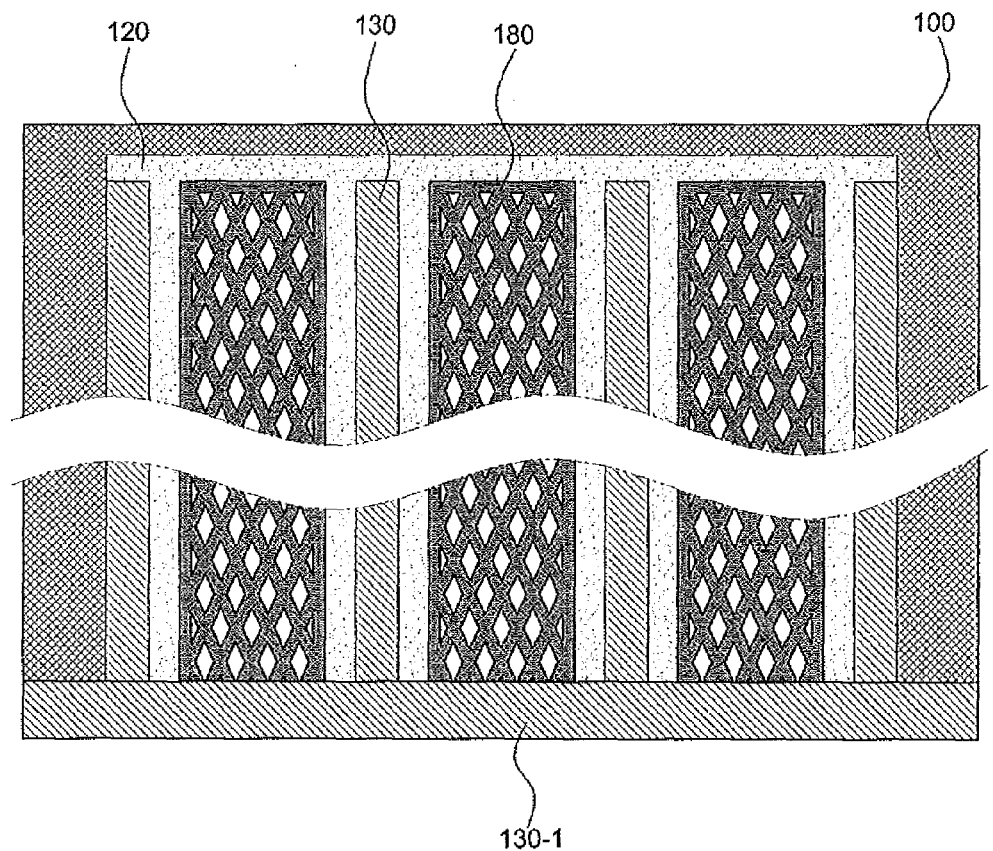

According to the second embodiment of the present invention, as illustrated in FIG. 2B, the metal wires 180 may be formed in a mesh type structure where the metal wires 180 cross each other diagonally, thereby increasing electricity collecting efficiency.

Meanwhile, in this embodiment, the thickness of the oxide semiconductor thick films 120 may cause an increase in the overall thickness of the dye-sensitized solar cell. The overall thickness, however, can be controlled by making the metal electrode 130 and/or the metal electrode protecting layer 140 thinner.

Third Embodiment

A dye-sensitized solar cell according to the third embodiment of the present invention has the same configuration as that of the second embodiment of the present invention, except for the position of the metal electrodes 130.

Figure 3A:
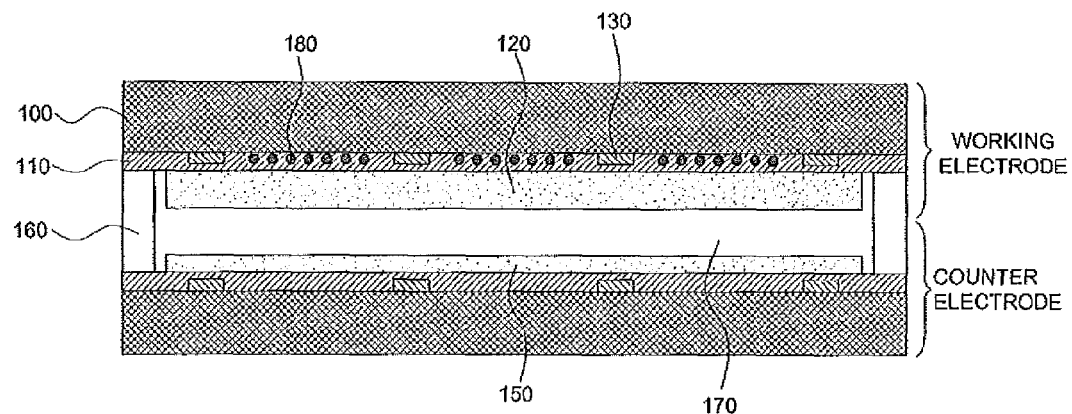
FIGS. 3A and 3B are sectional views illustrating a dye-sensitized solar cell according to the third embodiment of the present invention.

As illustrated in FIG. 3A, according to the third embodiment, the metal electrodes 130 of the working electrode and the metal electrodes 130 of the counter electrode are disposed inside the respective transparent conductive layers 110 on the outer surface of the respective transparent conductive layers 110 that each faces the inner surface of the respective transparent substrates 100. Accordingly, a uniform thickness of the oxide semiconductor thick film 120 (and the resulting dye-sensitized solar cell) can be ensured.

The metal wires 180, as illustrated in the first and second embodiments, may, suitably, be arranged inside the transparent conductive layer 110 on the outer surface of the transparent conductive layer 110 between adjacent metal electrodes 130 to thereby increase electricity collecting efficiency.

As the metal electrode 130 is disposed inside the transparent conductive layer 110, a separate metal electrode protecting layer 140 may not be necessary, which can reduce manufacturing steps and costs.

Figure 3B:
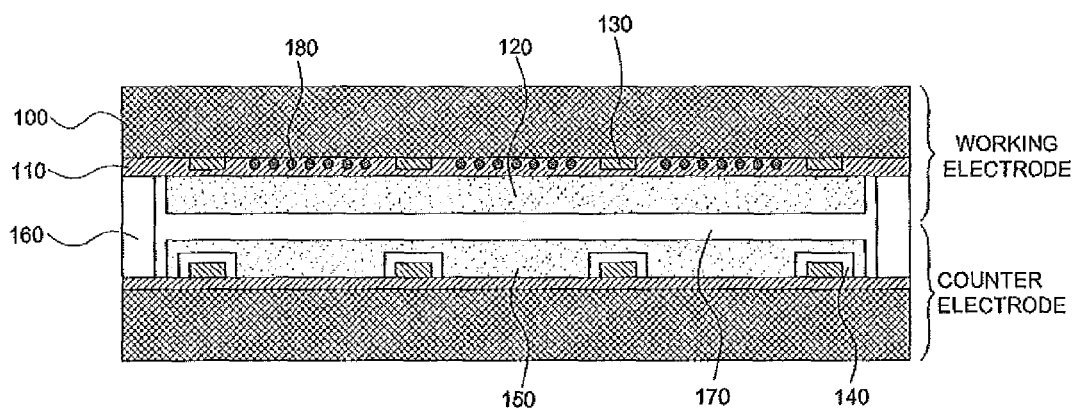

In some modified embodiments, as illustrated in FIG. 3B, the working electrode may have the above-described configuration while the counter electrode may have the same configuration as descried in the second embodiment.

Fourth Embodiment

A dye-sensitized solar cell according to the fourth embodiment of the present invention has the same working electrode as that of the third embodiment of the present invention, except for the position of the metal electrodes 130.

Figure 4A:
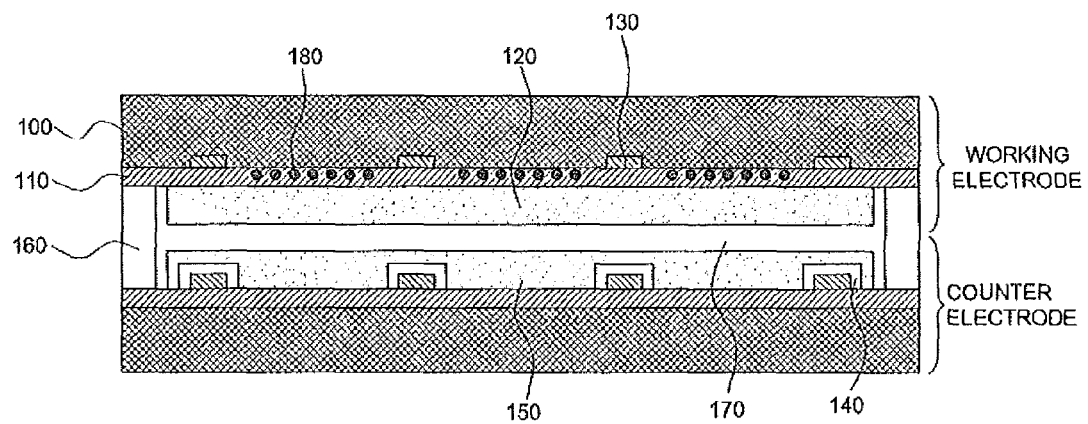
Figure 4B:
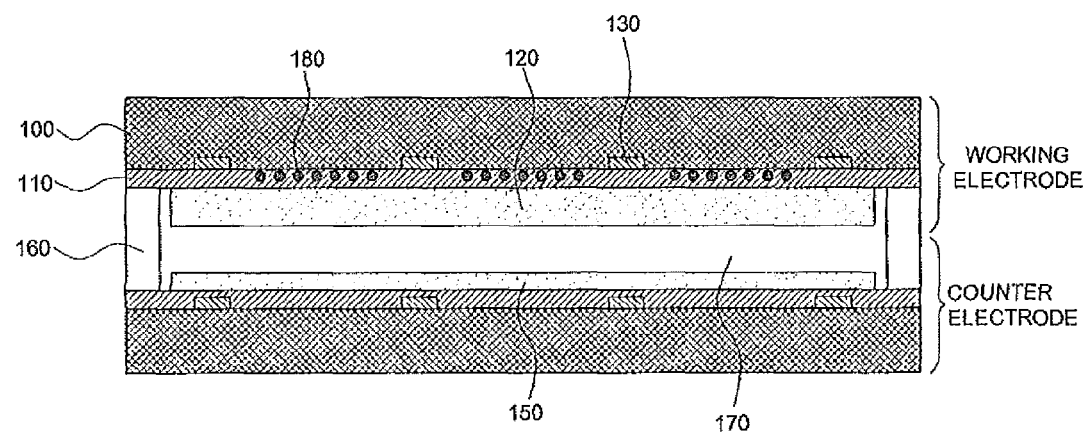
Figure 4C:
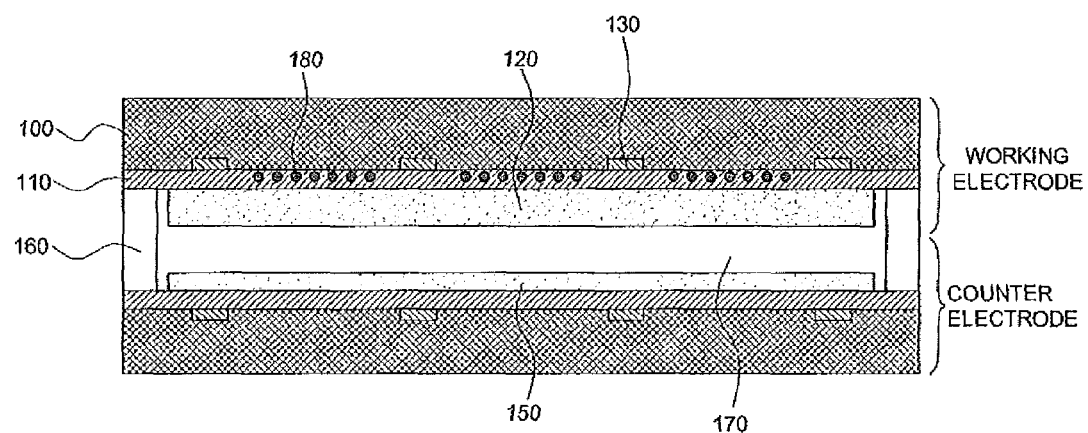

As illustrated in FIGS. 4A to 4C, according to the fourth embodiment, the transparent substrate 100 of the working electrode is provided with recesses on the inner surface thereof and the metal electrodes 130 of the working electrode are disposed inside the recesses.

The counter electrode may have the same structures as described in the other embodiments (e.g., FIG. 2A and FIG. 3A), as illustrated in FIGS. 4A and 4B. Also, the counter electrode may have the same structure as described in FIG. 4B except that the metal wires are disposed inside recesses provided with the transparent substrate 100, as illustrated in FIG. 4C.

For the same or similar reasons as described with respect the third embodiment, the manufacturing steps/costs can be reduced and an uniform thickness of the dye-sensitized solar sells can be ensured.

Fifth Embodiment

Figure 5A:
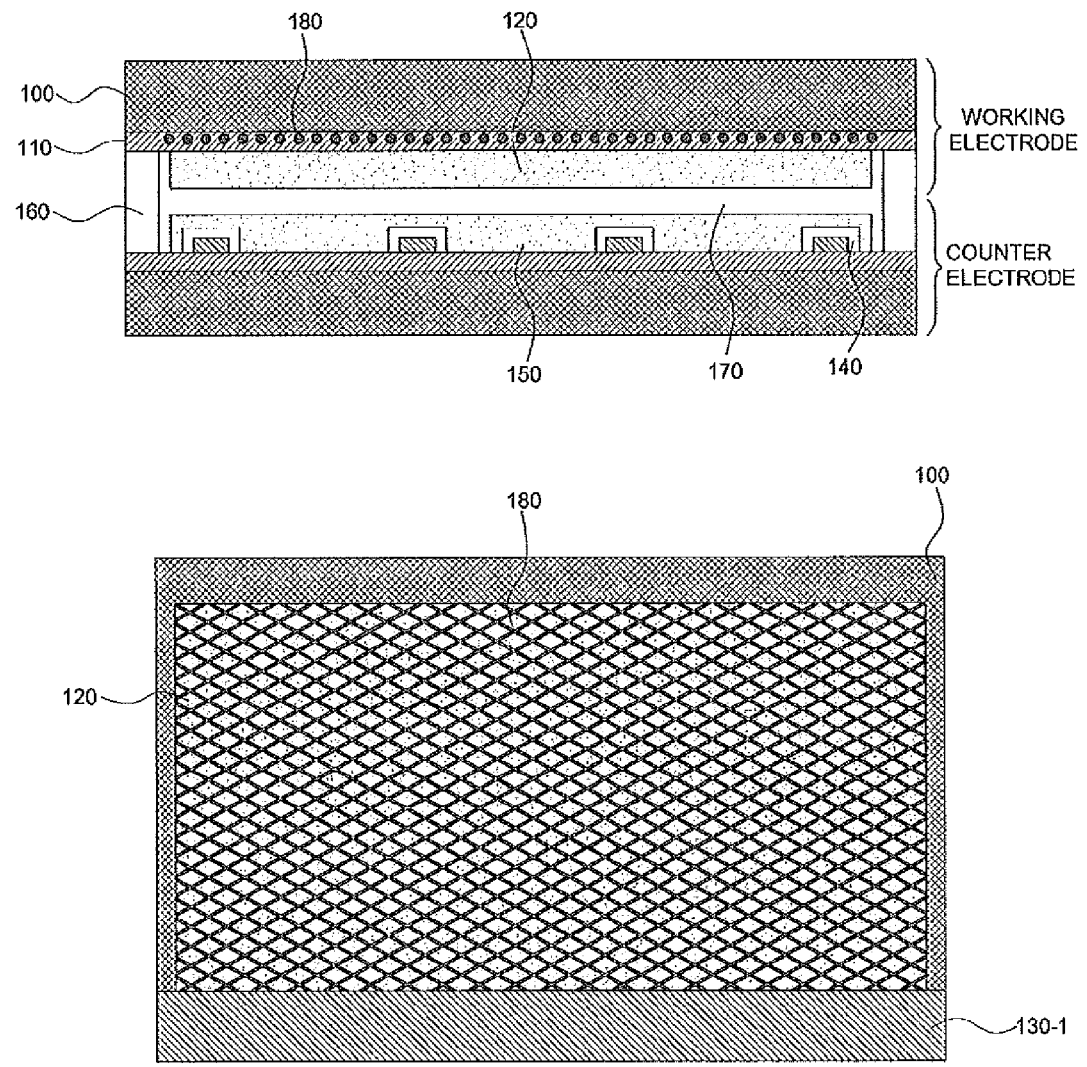
FIGS. 5A to 5C are sectional views illustrating a dye-sensitized solar cell according to the fifth embodiment of the present invention.

A dye-sensitized solar cell according to the fifth embodiment of the present invention has the same working electrode as that of the third embodiment of the present invention, except that the working electrode of the fifth embodiment does not have metal electrodes 130 and it has the metal wires 180 more densely, as illustrated in FIG. 5A.

The counter electrode may have the same structures as described in the other embodiments (e.g., FIG. 2A). In some modified embodiments, the counter electrode may also be provided with metal wires 180 in the same manner as the working electrode. Also, in some other modified embodiments, the metal electrodes of the counter electrode can be formed by metal wires 180.

Figure 5B:
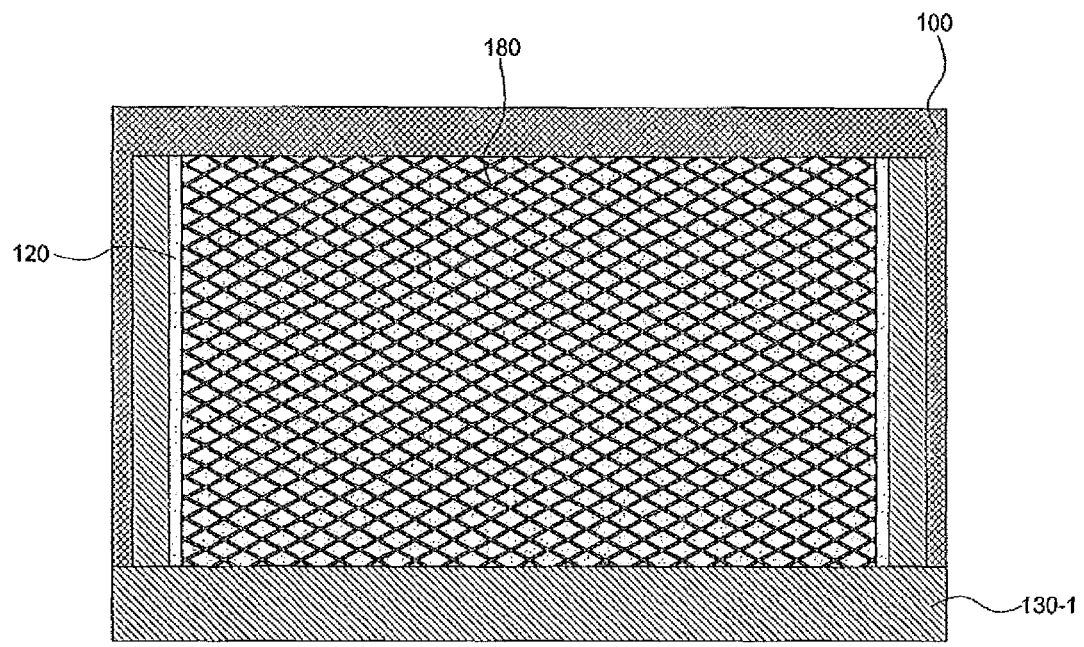
Figure 5C:
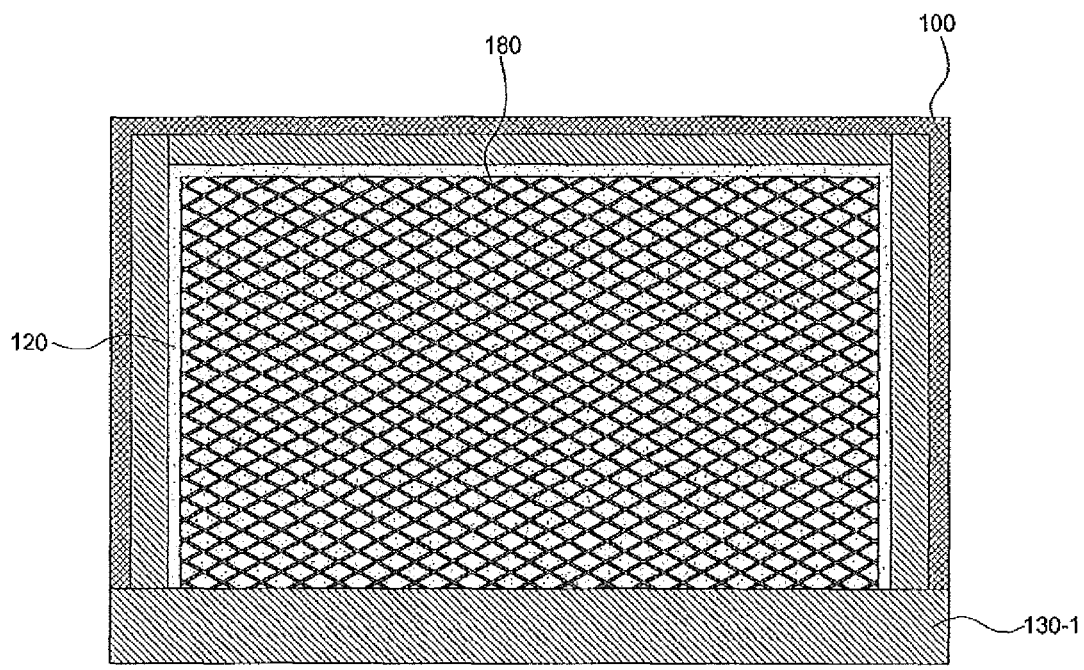

Preferably, as can be seen from FIGS. 5A to 5C, the metal wires 180 may cross each other to be inclined with respect to each other, or a metal band piece acting as a metal electrode may be formed wide only at peripheral portions of the metal wires 180, increasing electricity collecting efficiency.

As mentioned above, according to the fifth embodiment of the present invention, a performance of the solar cell can be enhanced, a thickness of the solar cell can be decreased, and a manufacturing of the solar cell can be simplified by increasing an effective area of the oxide semiconductor thick film 120 and replacing the metal electrode 130 by the metal wires 180.

Sixth Embodiment

A dye-sensitized solar cell according to the sixth embodiment of the present invention has the same working electrode as that of the fifth embodiment of the present invention, except that the working electrode of the sixth embodiment has the metal wires 180 inside the transparent substrate 100 (or on the inner surface thereof), as illustrated in FIGS. 6A to 6H. In some modified embodiments, the working electrode may have metal electrodes 130 in recesses formed in the inner surface of the transparent substrate 100 and it has metal wires 180 between adjacent metal electrodes 130, as illustrated in FIG. 6I.

Figure 6A:
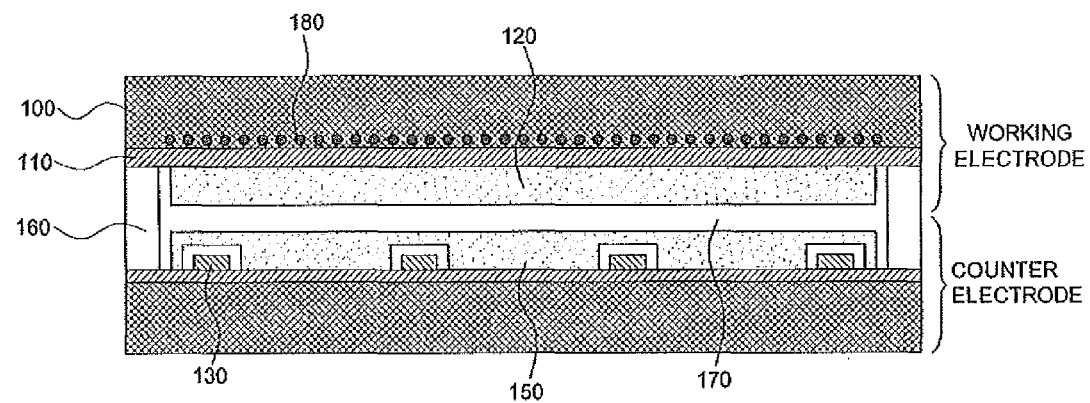
FIGS. 6A to 6I are sectional views illustrating a dye-sensitized solar cell according to the sixth embodiment of the present invention.
Figure 6B:
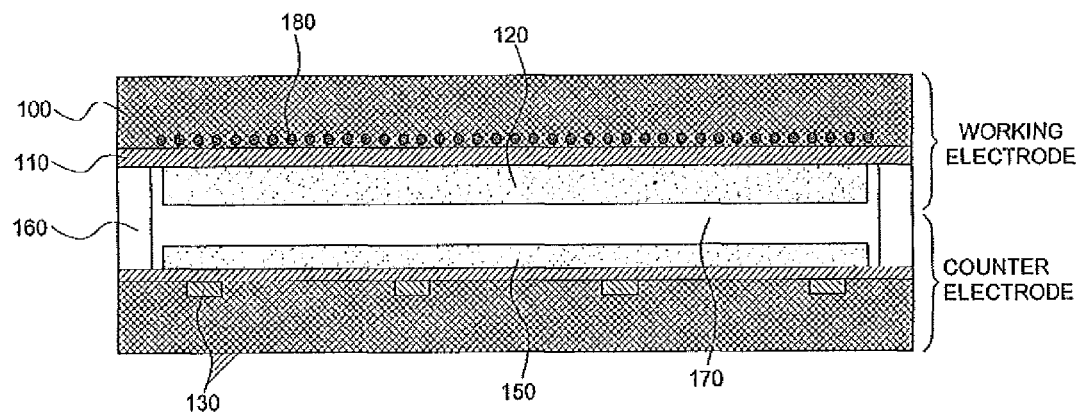
Figure 6C:
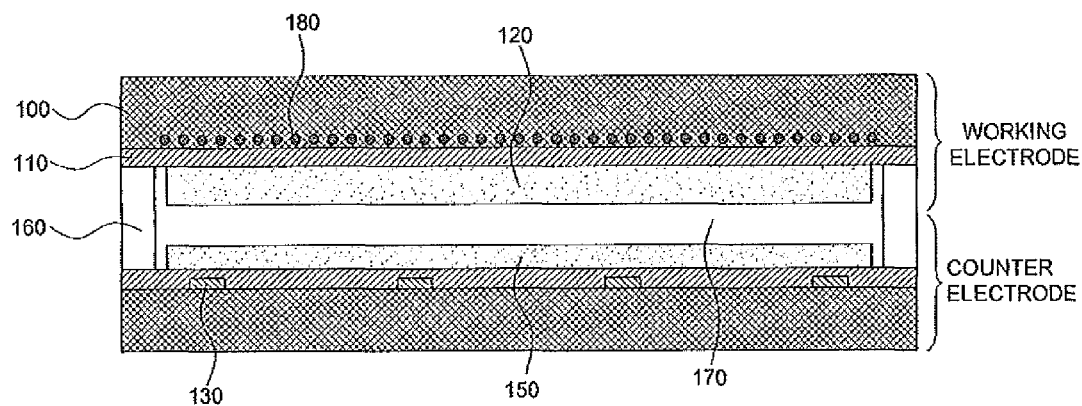
Figure 6D:
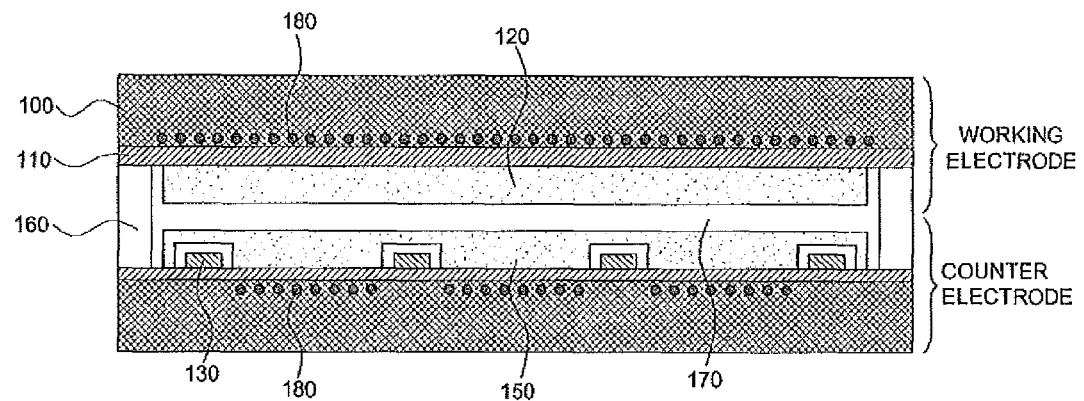
Figure 6E:
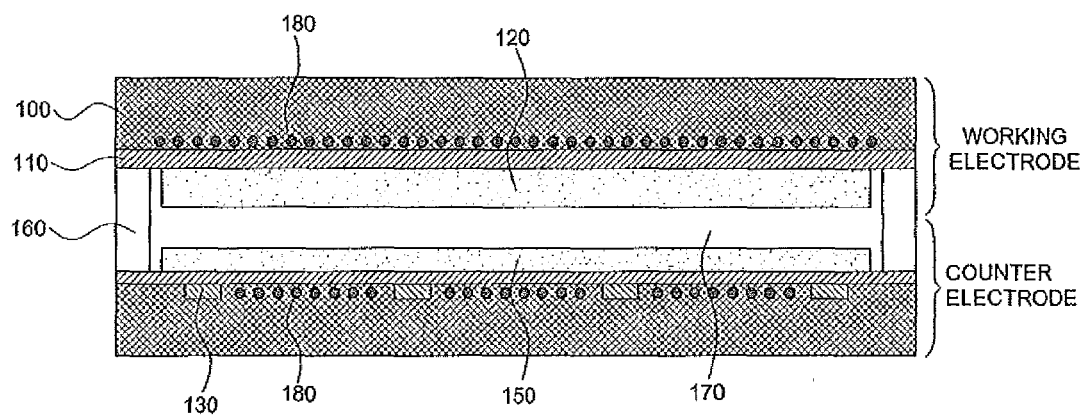
Figure 6F:
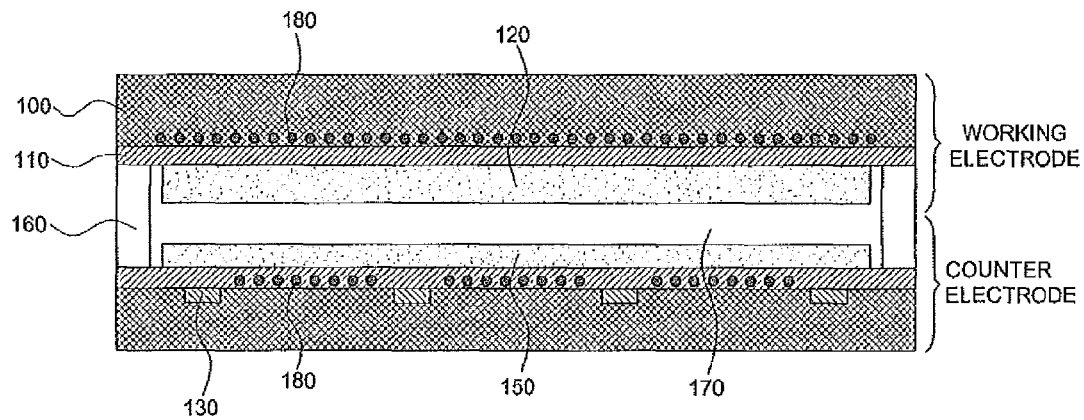
Figure 6G:
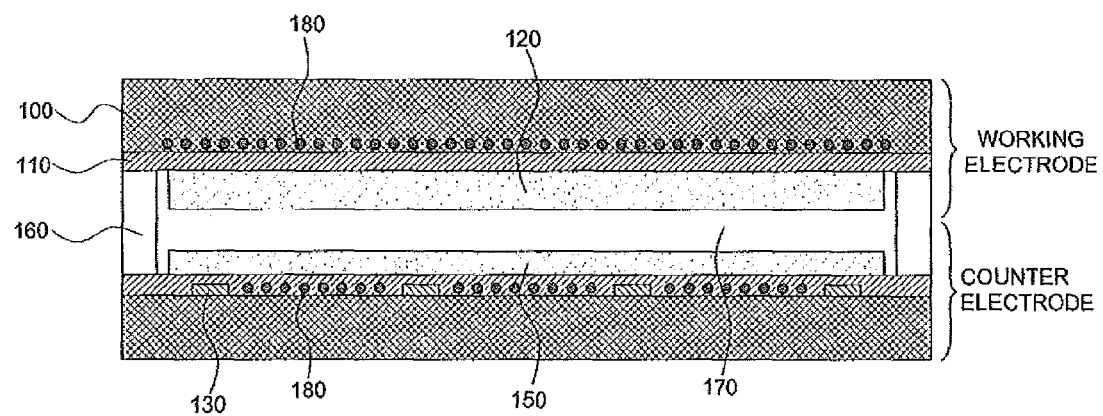
Figure 6H:
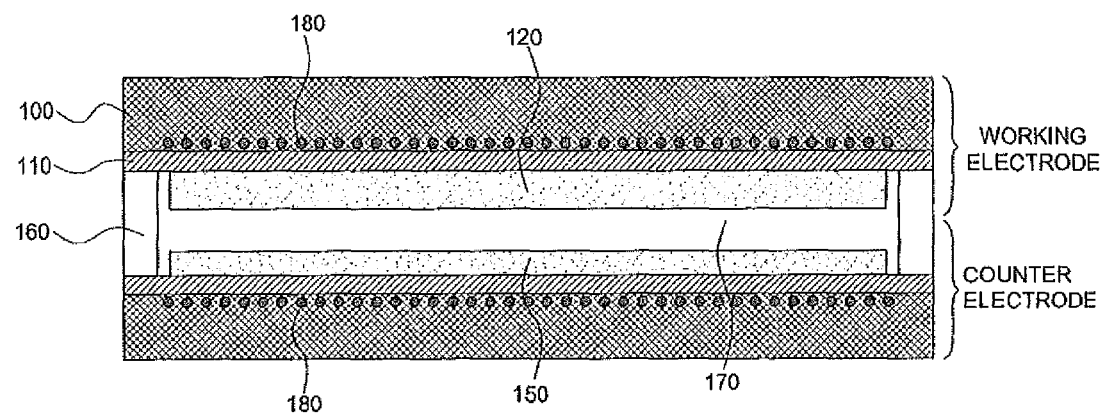
Figure 6I:
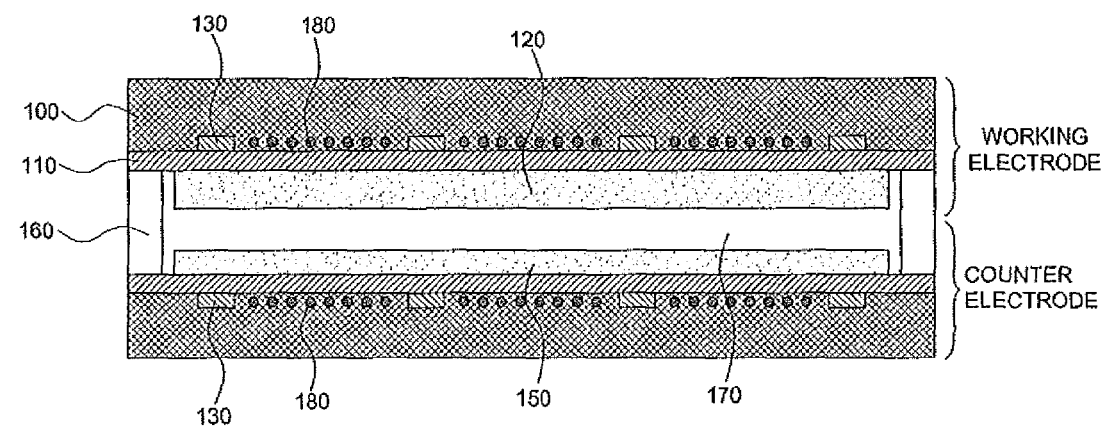

The counter electrode may have the same structures as described in the other embodiments (e.g., FIGS. 4A to 4C), as illustrated in FIGS. 6A to 6C. Also, the counter electrode may have modified structures as shown in FIGS. 6D to 6I, detailed description of which is omitted as the respective configurations are apparent from the above-described configurations.

Figure 7:
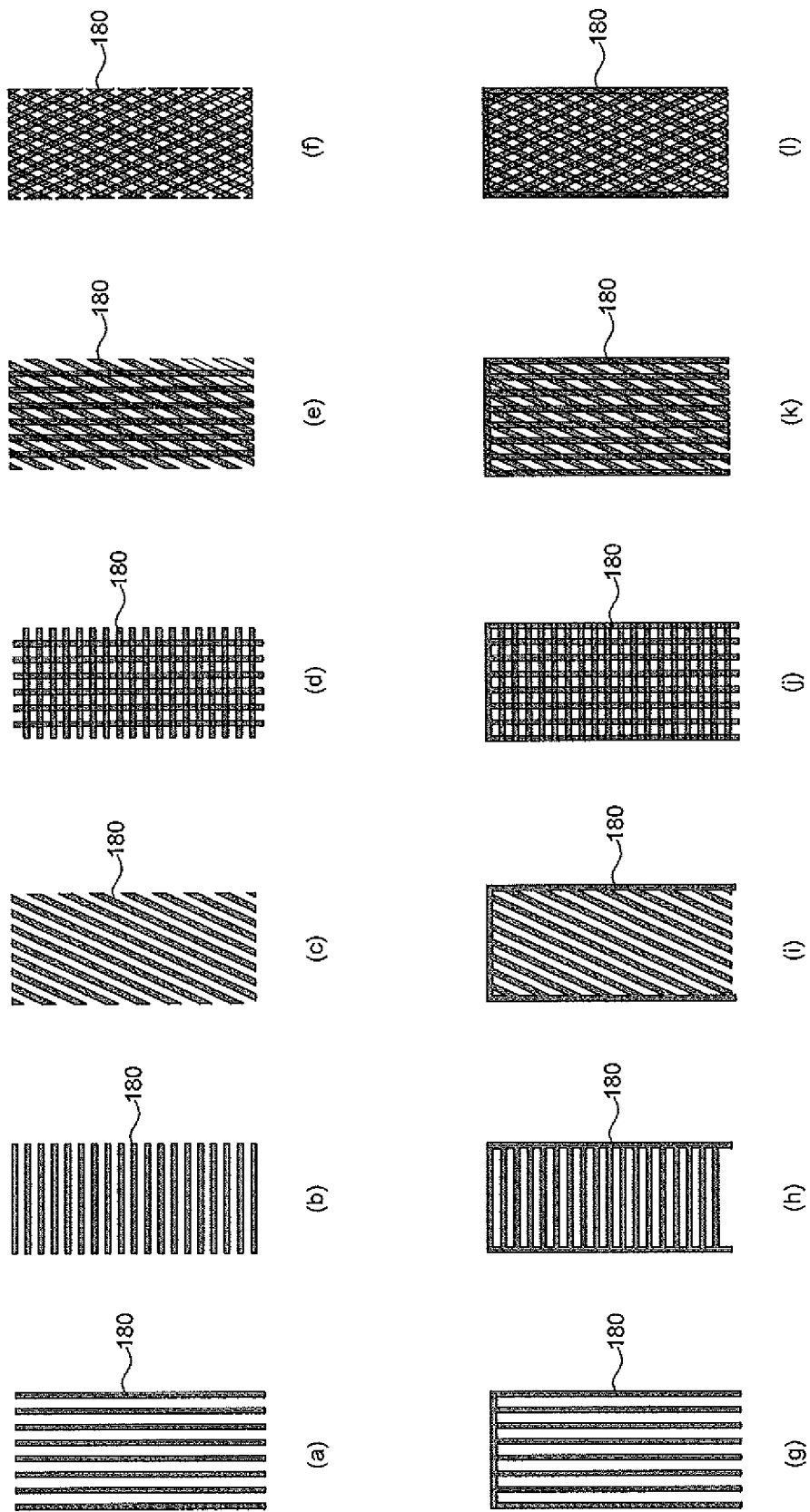
FIG. 7 is a view schematically illustrating examples of structure of metal wires that can be used in dye-sensitized solar cells according to the present invention.
Figure 8:
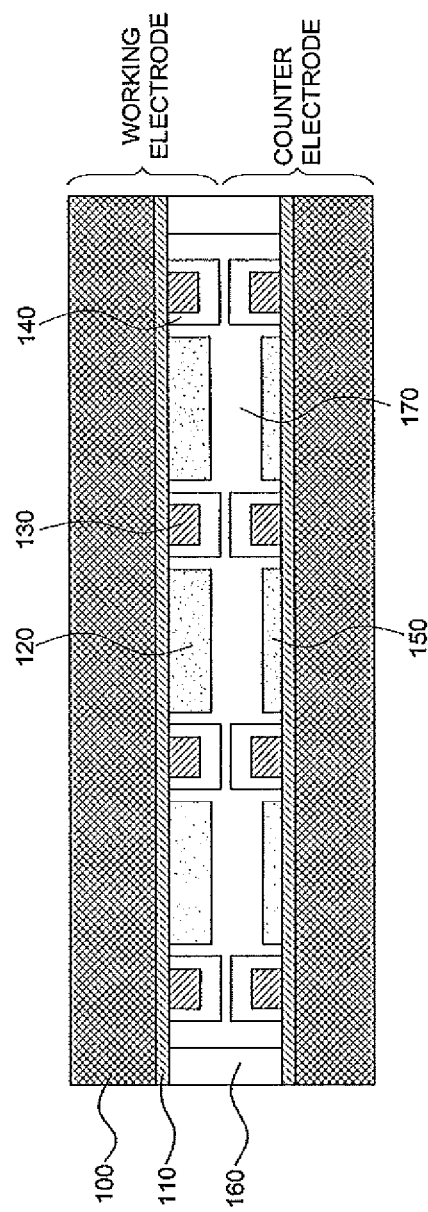
FIG. 8 is a sectional view illustrating a conventional dye-sensitized solar cell.

As such, the metal wires 180 can act as a collecting electrode of the working electrode and/or the counter electrode, increasing electricity collecting efficiency. Non-limiting examples of the structure of the metal wires 180 are illustrated in FIG. 7, in which the metal wires may be linearly arranged at equal intervals longitudinally or transversely; the metal wires may be linearly arranged at equal intervals obliquely, the metal wires may cross longitudinally and transversely; the metal wires may be arranged linearly in the longitudinal direction and obliquely in the transverse direction; the metal wires may cross each other obliquely; and the metal wires may have a peripheral rim.

The invention has been described in detail with reference to preferred embodiments thereof. However, it will be appreciated by those skilled in the art that changes may be made in these embodiments without departing from the principles and spirit of the invention (for example, configuring a dye-sensitized solar cell by combining a part or all of one embodiment with a part or all of another embodiment described in the specification; changing the position of the metal wires, etc.), the scope of which is defined in the appended claims and their equivalents.

What is claimed is:

1. A dye-sensitized solar cell comprising:
a working electrode including:
   a transparent conductive layer coated on a surface of a transparent substrate,
   an oxide semiconductor thick film absorbed with a dye that absorbs light and emits electrons, and
   a first plurality of metal electrodes connected to a collector electrode; and
a counter electrode including:
   a transparent conductive layer coated on a surface of a transparent substrate,
   a second plurality of metal electrodes connected to the collector electrode, and
   a plurality of catalytic electrodes,
wherein metal wires are formed in the transparent substrate of the working electrode or in the transparent conductive layer of the working electrode, the metal wires are arranged between the first plurality of metal electrodes of the working electrode so as not to be overlapped with the metal electrodes of the working electrode but overlapped with the oxide semiconductor thick film, and the metal wires are conductively connected to a collector electrode,
wherein the metal wires each have a width and a height of less than the metal electrodes of the working electrode preventing degradation of the transparency of the dye-sensitized solar cell, and the first and second plurality of the metal electrodes are formed on an inner surface of the transparent conductive layer of the working electrode and the counter electrode respectively at equal intervals.

2. The dye-sensitized solar cell of claim 1, wherein the metal electrodes of the working electrodes are covered by the oxide semiconductor thick film formed on a surface of the transparent conductive layer, and the metal electrodes of the working electrodes are covered by the catalytic electrodes.

3. The dye-sensitized solar cell of claim 1, wherein the metal electrodes of the working electrode and the metal electrodes of the counter electrode are disposed inside recesses provided with the respective transparent substrates.

4. The dye-sensitized solar cell of claim 1, wherein the metal wires form one structure selected from a structure where the metal wires are linearly arranged at equal intervals longitudinally or transversely, a structure where the metal wires are linearly arranged at equal intervals obliquely, a mesh type structure where the metal wires cross longitudinally and transversely, a mesh type structure where the metal wires are arranged linearly in a longitudinal direction and arranged obliquely in a transverse direction, and a mesh type structure where the metal wires cross each other obliquely.

5. The dye-sensitized solar cell of claim 1, wherein each of the metal wires has a width of 0.001 to 2000 micrometers and a height of 0.001 to 20 micrometers.

6. The dye-sensitized solar cell of claim 1, wherein each of the metal wires has a width of 0.001 to 1000 micrometers and a height of 0.001 to 10 micrometers.

7. The dye-sensitized solar cell of claim 1, wherein the metal wires are formed by coating a liquid containing a metal, a gas, or a solid on a surface portion or portions of the transparent substrate or the transparent conductive layer through one selected screen printing, inkjet printing, gravure coating, bar coating, spraying, and sputtering, or by directly forming shapes of metal wires on the surface portion of portions.

* * * * *